US008441377B2

(12) United States Patent
Liu

(10) Patent No.: US 8,441,377 B2
(45) Date of Patent: May 14, 2013

(54) METHOD OF DYNAMICALLY ADJUSTING LONG-PRESS DELAY TIME, ELECTRONIC DEVICE, AND COMPUTER-READABLE MEDIUM

(75) Inventor: Ching-Tung Liu, Taoyuan County (TW)

(73) Assignee: HTC Corporation, Taoyuan County (TW)

( * ) Notice: Subject to any disclaimer, the term of this patent is extended or adjusted under 35 U.S.C. 154(b) by 615 days.

(21) Appl. No.: 12/702,307

(22) Filed: Feb. 9, 2010

(65) Prior Publication Data

US 2010/0328112 A1 Dec. 30, 2010

Related U.S. Application Data

(60) Provisional application No. 61/220,182, filed on Jun. 24, 2009.

(30) Foreign Application Priority Data

Dec. 16, 2009 (TW) ................................ 98143238 A

(51) Int. Cl.
H03K 17/94 (2006.01)
(52) U.S. Cl.
USPC ................ 341/24; 341/22; 345/168; 345/169
(58) Field of Classification Search .............. 341/22–24; 345/168–169
See application file for complete search history.

(56) References Cited

U.S. PATENT DOCUMENTS

| 5,714,983 | A  | * | 2/1998 | Sacks ........................... 345/168 |
| 6,346,894 | B1 | * | 2/2002 | Connolly et al. ............... 341/22 |
| 6,744,422 | B1 | * | 6/2004 | Schillings et al. ........... 345/169 |
| 7,561,072 | B2 | * | 7/2009 | Pham ............................. 341/23 |
| 7,872,595 | B2 | * | 1/2011 | Park et al. ...................... 341/22 |
| 2006/0033718 | A1 | | 2/2006 | Griffin |
| 2009/0104943 | A1 | | 4/2009 | Park et al. |

FOREIGN PATENT DOCUMENTS

| EP | 0957425 | 11/1999 |
| FR | 2841717 | 1/2004 |
| WO | 2007068505 | 6/2007 |

OTHER PUBLICATIONS

"European Search Report of European Counterpart Application", issued on Jun. 14, 2010, p. 1-p. 3.
"Office Action of European Counterpart Application", issued on Jun. 29, 2010, p. 1-p. 7.

* cited by examiner

Primary Examiner — Khai M Nguyen
(74) Attorney, Agent, or Firm — Jianq Chyun IP Office

(57) ABSTRACT

A method of dynamically adjusting a long-press delay time, an electronic device using the method, and a computer-readable medium are provided, wherein the electronic device has a plurality of keys. When a pressed time corresponding to a key of the electronic device exceeds a long-press delay time of the key, the electronic device executes a long-press function corresponding to the key. In the present method, a plurality of key inputs is first received. Then, the long-press delay time of the key is set according to the input rate related to the received key inputs. Thereby, the electronic device can respond appropriately according to the typing speed of a user, so as to offer the user a smooth operating experience.

21 Claims, 5 Drawing Sheets

METHOD OF DYNAMICALLY ADJUSTING LONG-PRESS DELAY TIME, ELECTRONIC DEVICE, AND COMPUTER-READABLE MEDIUM

CROSS-REFERENCE TO RELATED APPLICATION

This application claims the priority benefit of U.S. provisional application Ser. No. 61/220,182, filed on Jun. 24, 2009. This application also claims the priority benefit of Taiwan application serial No. 98143238, filed on Dec. 16, 2009. The entirety of each of the above-mentioned patent applications is hereby incorporated by reference herein and made a part of this specification.

BACKGROUND OF THE APPLICATION

1. Field of the Application

The present application generally relates to a method of dynamically adjusting a long-press delay time of an electronic device, and more particularly, to a method of adjusting a long-press delay time of an electronic device according to the rate of the electronic device receiving key inputs, the electronic device, and a computer-readable medium.

2. Description of Related Art

The number of keys on a mobile electronic device has to be kept as low as possible in order to keep the volume of the electronic device small. Accordingly, each key is usually corresponding to more than one input character. A user can switch between the input characters corresponding to a single key by continuously pressing the key. Besides, since most mobile electronic devices support a long-press function corresponding to each key, the user can directly input a specific input character or execute a specific function corresponding to a key by pressing the key for a time greater than a predetermined long-press delay time of the electronic device.

However, the predetermined long-press delay time does not suit every user with different typing speed. In other words, a user with a faster typing speed may find the predetermined long-press delay time too long and accordingly produce typing breaks, while a user with a slower typing speed may find the predetermined long-press delay time too short and accordingly produce input errors.

SUMMARY OF THE APPLICATION

Accordingly, the present application is directed to a method of dynamically adjusting a long-press delay time and an electronic device and a computer-readable medium, wherein the long-press delay time can be dynamically adjusted according to the typing speed of a user.

The present application provides a method of dynamically adjusting a long-press delay time. The method is adaptable to an electronic device having a plurality of keys. When a pressed time corresponding to a key of the electronic device exceeds a long-press delay time of the key, the electronic device executes a long-press function corresponding to the key. In the present method, a plurality of key inputs is received, and the long-press delay time of the key of the electronic device is set according to a key input rate related to the received key inputs.

The present application also provides an electronic device including a plurality of keys and a processing unit. The processing unit is coupled to the keys. When a pressed time corresponding to one of a key of the electronic device exceeds a long-press delay time of the key, the processing unit executes a long-press function corresponding to the key. When a plurality of key inputs is received, the processing unit sets the long-press delay time of the key of the electronic device according to a key input rate related to the received key inputs.

The present application further provides a computer-readable medium including stored thereon instructions, which, when executed by a processor in an electronic device having a plurality of keys, cause the processor to perform the operations of receiving a plurality of key inputs, and setting a long-press delay time of a key of the electronic device according to a key input rate related to the received key inputs. When a pressed time corresponding to the key exceeds the long-press delay time of the key, the processor executes a long-press function corresponding to the key.

BRIEF DESCRIPTION OF THE DRAWINGS

The accompanying drawings are included to provide a further understanding of the application, and are incorporated in and constitute a part of this specification. The drawings illustrate embodiments of the application and, together with the description, serve to explain the principles of the application.

DESCRIPTION OF THE EMBODIMENTS

Figure 1:
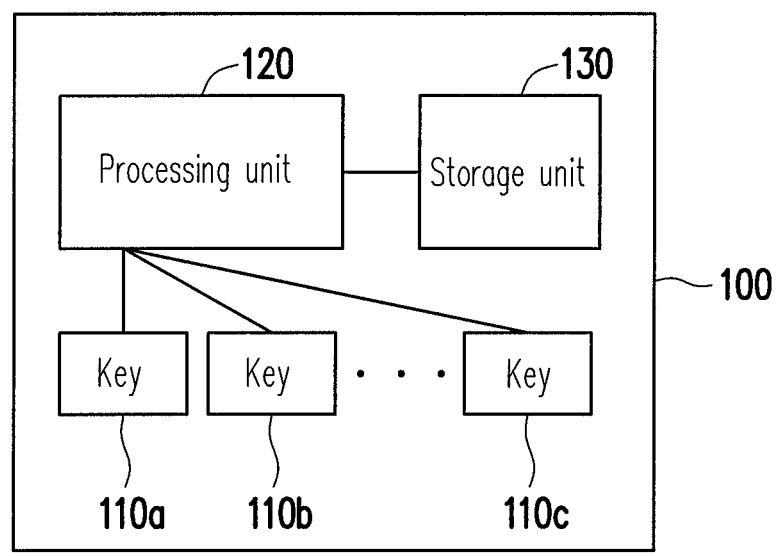
FIG. 1 is a block diagram of an electronic device according to an embodiment of the present application.

Reference will now be made in detail to the present preferred embodiments of the application, examples of which are illustrated in the accompanying drawings. Wherever possible, the same reference numbers are used in the drawings and the description to refer to the same or like parts.

FIG. 1 is a block diagram of an electronic device according to an embodiment of the present application. Referring to FIG. 1, the electronic device 100 includes a plurality of keys (for example, keys 110*a*, 110*b*, and 110*c*), a processing unit 120, and a storage unit 130. The electronic device 100 may be a cell phone, a personal digital assistant (PDA), a PDA phone, a smart phone, a computer, a music player, a game console, a digital camera, or any other electronic device with at least one key.

The keys 110*a*, 110*b*, and 110*c* may be physical keys or virtual keys on the electronic device 100. All the keys are coupled to the processing unit 120, and the processing unit 120 may be a hardware (for example, a chipset), a software component, or the combination of a hardware and a software component with calculating and processing capabilities. The storage unit 130 is coupled to the processing unit 120, and which may be a memory, a memory card, or any other storage device.

In the present embodiment, when a pressed time corresponding to any one of the keys exceeds a long-press delay time of the pressed key, the processing unit 120 executes a long-press function corresponding to the pressed key, wherein the pressed time may be the time that a user constantly presses a physical key or touches a key on a touch screen of the electronic device 100 or the time of inputting a signal into the electronic device 100 by constantly using any other key. However, the pressed time may be the time that the electronic device 100 identifies the key is being pressed. Taking a software key as an example, the pressed time of the software key may be the time the finger or stylus contacting or closing to the software key to make the electronic device 100 identify the software key is being pressed. Besides, the processing unit 120 adjusts the long-press delay time of the key according to a key input rate after the electronic device 100 has received some key inputs.

In order to determine the key input rate, the processing unit 120 first calculates an input time corresponding to m key inputs, wherein m is a positive integer. If the input time is less than a threshold time, it is determined that the key input rate is fast, and accordingly the processing unit 120 sets the long-press delay time to be a smaller first predetermined value. If the input time is greater than the threshold time, it is determined that the key input rate is slow, and accordingly the processing unit 120 sets the long-press delay time to be a larger second predetermined value.

In other words, if the processing unit 120 determines that the input time of the m key inputs is less than the threshold time (i.e., the user is very proficient in the input operation), the processing unit 120 shortens the long-press delay time of the key of the electronic device 100 to avoid any inconvenience to the user caused by typing breaks. Contrarily, if the processing unit 120 determines that the input time of the m key inputs is greater than the threshold time (i.e., the user is currently typing at a slow speed), the processing unit 120 prolongs the long-press delay time to slow down the response of the electronic device 100 and prevent the user from making input errors.

Figure 2:
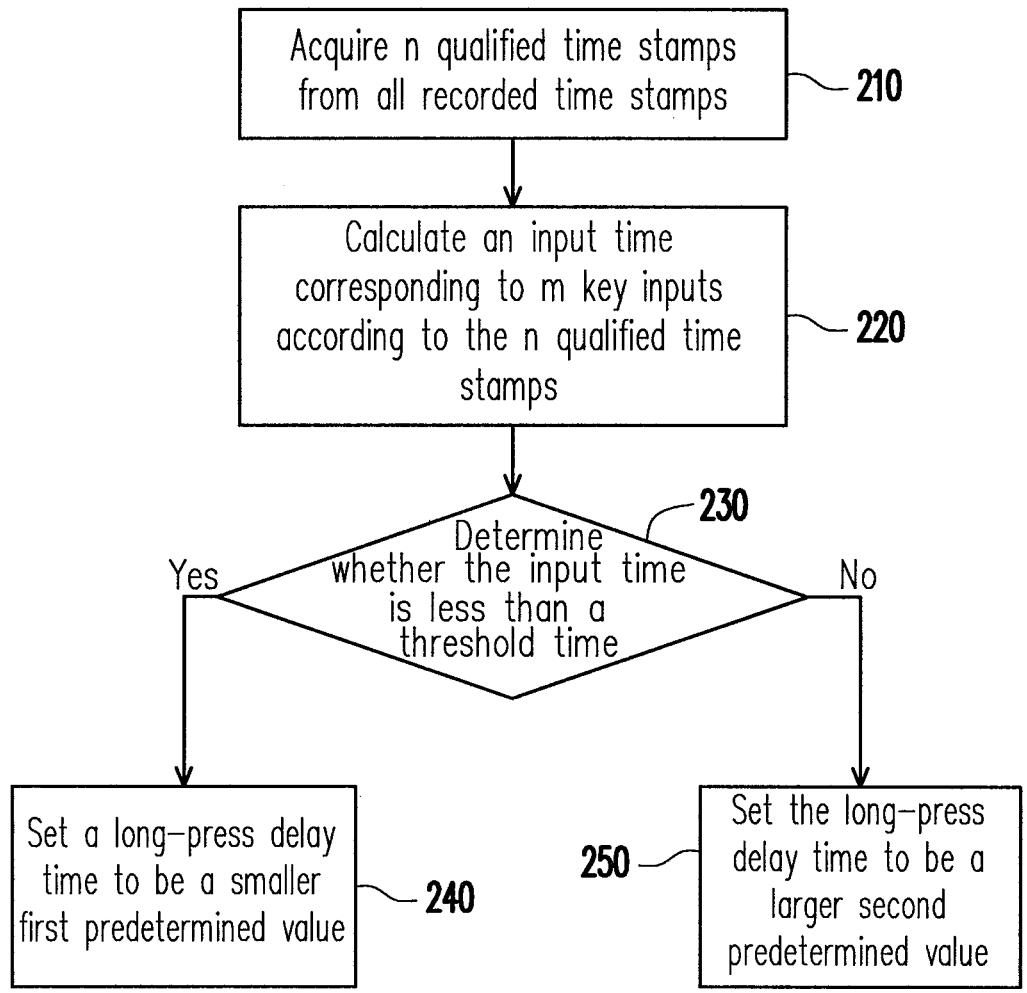
FIG. 2 is a flowchart illustrating a method of dynamically adjusting a long-press delay time according to an embodiment of the present application.

The mechanism of calculating the input time and adjusting the long-press delay time adopted by the processing unit 120 will be described herein with reference to accompanying drawings. FIG. 2 is a flowchart illustrating a method of dynamically adjusting a long-press delay time according to an embodiment of the present application. Referring to FIG. 2, in the present embodiment, the electronic device 100 receives a plurality of key inputs, and the processing unit 120 records the time stamps corresponding to receiving time points of the key inputs into the storage unit 130. In other words, every time when the electronic device 100 receives a key input, the processing unit 120 records the time stamp corresponding to the receiving time point of the key input into the storage unit 130.

In order to calculate the input time of m key inputs to reflect the key input rate, first, in step 210, the processing unit 120 acquires n qualified time stamps from all the time stamps recorded in the storage unit 130, wherein n is an integer greater than 1. In step 220, the processing unit 120 calculates the input time corresponding to the m key inputs according to the n qualified time stamps.

In an embodiment, each of the qualified time stamps acquired by the processing unit 120 refers to such a time stamp that the key input corresponding to the time stamp has to be a character key input. The character key input is, for example, a letter key input, a number key input, or a symbol key input. To be specific, if a key input is a letter key input, a number key input, or a symbol key input, the time stamp thereof is a qualified time stamp, and if the key input is not a letter, number, or symbol key input (for example, it is a space key input), the time stamp thereof is an unqualified time stamp. However, the present application is not limited to foregoing definition, and in other embodiments of the present application, the character key inputs corresponding to qualified time stamps may vary along with the actual design requirements. For example, when a key input is a letter key input or a number key input, the time stamp thereof is a qualified time stamp, and when a key input is neither a letter key input nor a number key input (for example, it is a symbol key input or a space key input), the time stamp thereof is an unqualified time stamp. Accordingly, the processing unit 120 calculates (m−1) time intervals according to the n qualified time stamps and calculates a total of the (m−1) time intervals as the input time corresponding to the m key inputs, wherein each of the (m−1) time intervals is obtained from two adjacent qualified time stamps.

Figure 3A:
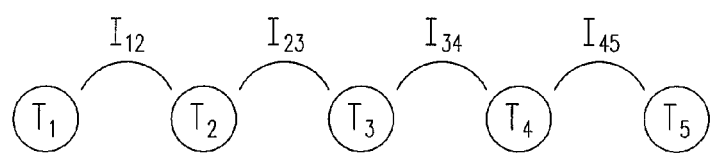
FIG. 3A and FIG. 3B are diagrams illustrating time stamps and time intervals according to an embodiment of the present application.

For the convenience of description, it is assumed that m is 5 and the time stamps T1-T5 shown in FIG. 3A are five time stamps acquired by the processing unit 120 from the storage unit 130. If the time stamps T1-T5 are all qualified time stamps, the processing unit 120 calculates the total of the time intervals $I_{12}$, $I_{23}$, $I_{34}$, and $I_{45}$ as the input time corresponding to the five key inputs.

Figure 3B:
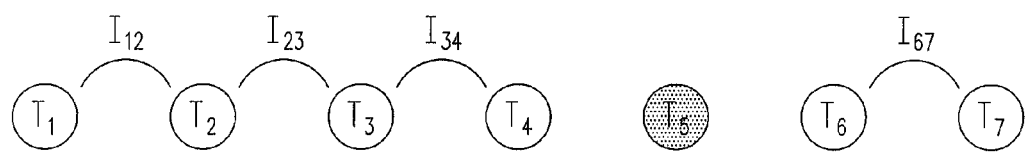

However, as shown in FIG. 3B, if the four time stamps T1-T4 acquired by the processing unit 120 are all qualified time stamps, but the fifth time stamp T5 acquired by the processing unit 120 is not a qualified time stamp, because four time intervals formed by adjacent qualified time stamps are required for calculating the input time corresponding to five key inputs, the processing unit 120 has to acquire other time stamps from the storage unit 130. Assuming that the following time stamps T6 and T7 acquired by the processing unit 120 are both qualified time stamps, the processing unit 120 calculates the total of the time intervals $I_{12}$, $I_{23}$, $I_{34}$, and $I_{67}$ as the input time of the five key inputs.

In the embodiment described above, while calculating the input time of the m key inputs, the processing unit 120 has to acquire n qualified time stamps from the storage unit 130 to generate (m−1) time intervals formed by adjacent qualified time stamps. The value of n is related to the value of m and the continuity of the qualified time stamps in the storage unit 130. In addition, it should be understood that the symbols T1 to T7 in FIG. 3A and FIG. 3B are only used for indicating the continuity of the time stamps in the storage unit 130 but not the sequence thereof. In other words, the time stamp T7 may not be the latest time stamp in the storage unit 130.

In another embodiment, the processing unit 120 acquires two qualified time stamps from the storage unit 130 and calculates the difference between the two qualified time stamps as the input time of the m key inputs, and the key inputs corresponding to the two qualified time stamps are respectively the $i^{th}$ key input and the $(i+m-1)^{th}$ key input. For example, when i=1 and m=5, the two qualified time stamps are respectively the time stamp T1 corresponding to the $1^{st}$ key input and the time stamp T5 corresponding to the $5^{th}$ key input, and the processing unit 120 calculates the difference between the time stamps T5 and T1 as the input time of five key inputs. It should be noted that when i=1, the storage unit 130 should record at least m time stamps in order to allow the processing unit 120 to acquire two qualified time stamps and calculate the input time of m key inputs.

In the two embodiments described above, the n qualified time stamps acquired by the processing unit 120 include the latest time stamp recorded in the storage unit 130. However, in other embodiments of the present application, the n qualified time stamps acquired by the processing unit 120 may not include the latest time stamp recorded in the storage unit 130. In addition, the method of calculating the input time of m key inputs is not limited in the present application, and the processing unit 120 may also calculate the input time corresponding to m key inputs through other methods after it acquires the n qualified time stamps.

After the input time is calculated, in step 230, the processing unit 120 determines whether the input time is less than a threshold time (for example, 2500 ms). If the input time is less than the threshold time, in step 240, the processing unit 120 sets the long-press delay time to be a first predetermined value (for example, 400 ms). If the input time is not greater than the threshold time, in step 250, the processing unit 120 sets the long-press delay time to be a second predetermined value (for example, 750 ms).

Figure 4:
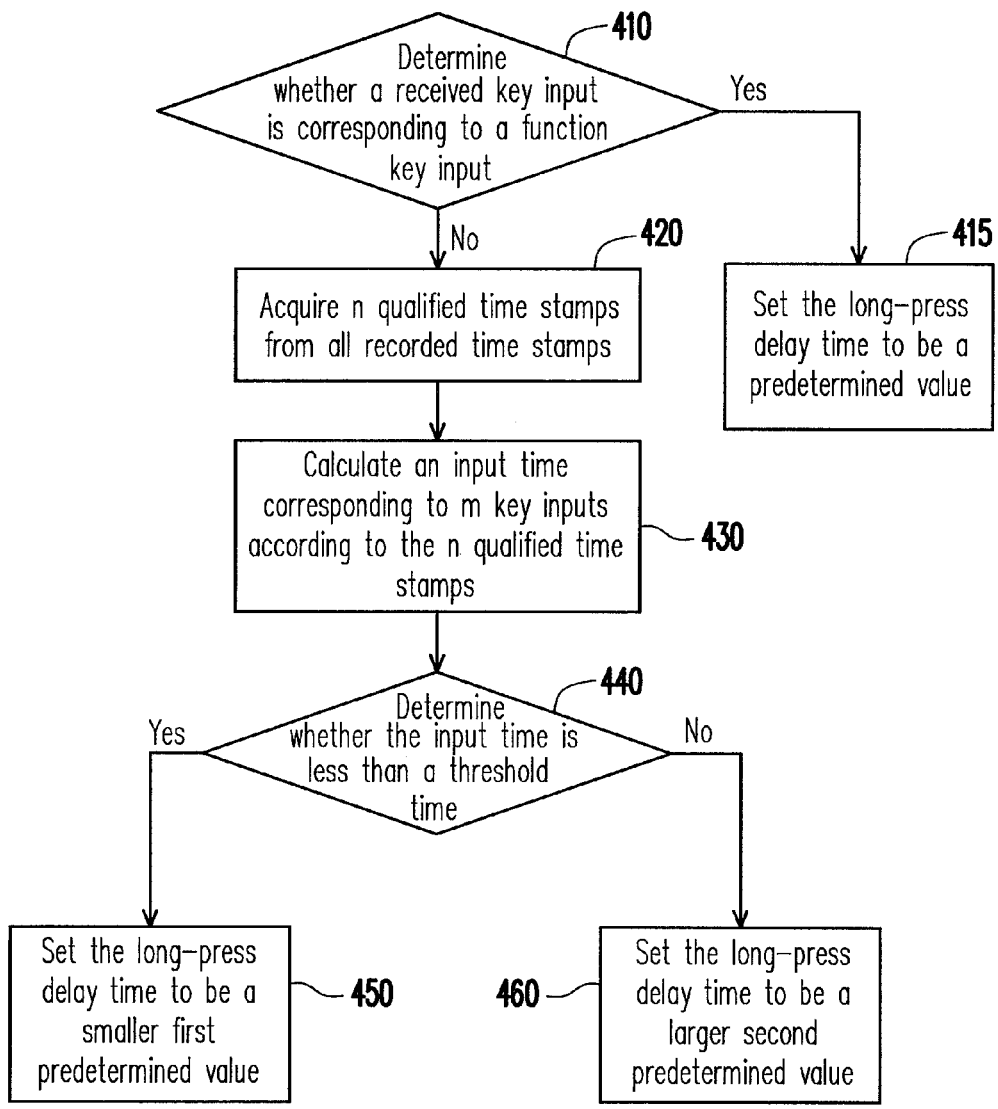
FIG. 4 is a flowchart illustrating a method of dynamically adjusting a long-press delay time according to another embodiment of the present application.

FIG. 4 is a flowchart illustrating a method of dynamically adjusting a long-press delay time according to another embodiment of the present application. Referring to FIG. 4, in step 410, every time when the electronic device 100 receives a key input, the processing unit 120 determines whether the key input is corresponding to a function key input (for example, a backspace key input, a direction key input, or a delete key input). To be specific, if the key input is a backspace key input, a direction key input, or a delete key input, an input error may be produced by the user. Thus, in step 415, the processing unit 120 directly sets the long-press delay time to be a predetermined value regardless of the current value of the long-press delay time.

However, if the key input is not one of aforementioned function key inputs, the processing unit 120 acquires n qualified time stamps from the storage unit 130 and calculates the input time of m key inputs, so as to determine whether to set the long-press delay time to be a smaller first predetermined value or a larger second predetermined value. The steps 420-460 in FIG. 4 are the same as or similar to the steps 210-250 in FIG. 2 therefore will not be described herein.

It should be noted that in step 410, when the electronic device 100 determines whether the key input is corresponding to a function key input, the type of the function key input may vary along with different design requirements. For example, in an embodiment, the processing unit 120 executes step 415 only when the key input is corresponding to the backspace key input. However, the processing unit 120 executes step 420 if the key input is not corresponding to the backspace key input (for example, it is corresponding to the direction key input or the delete key input).

Figure 5:
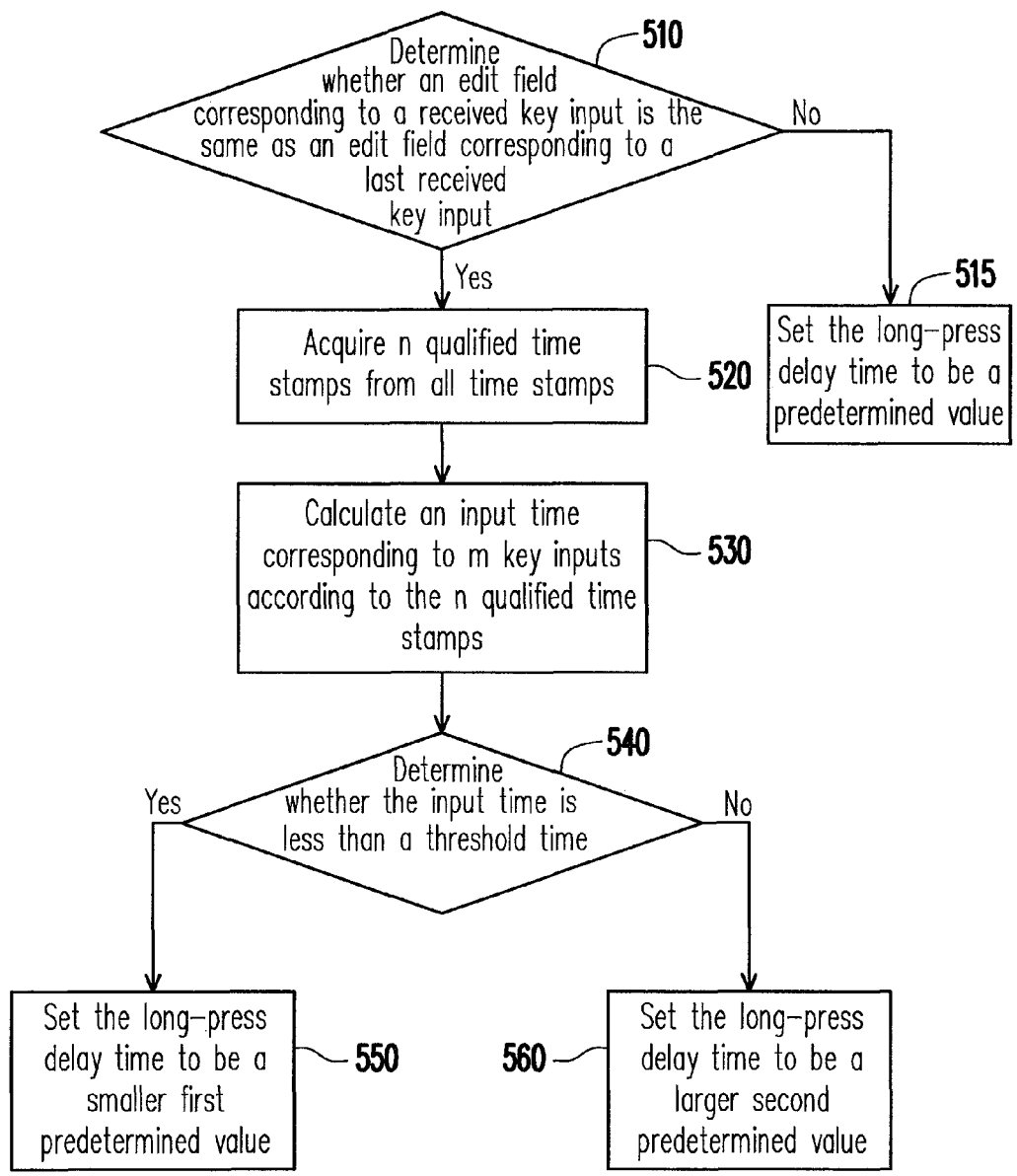
FIG. 5 is a flowchart illustrating a method of dynamically adjusting a long-press delay time according to yet another embodiment of the present application.

FIG. 5 is a flowchart illustrating a method of dynamically adjusting a long-press delay time according to yet another embodiment of the present application. The steps in FIG. 5 are similar to those in FIG. 4, and the difference between the two embodiments is that the step 410 in FIG. 4 is replaced by the step 510 in FIG. 5. In step 510, every time when the electronic device 100 receives a key input, the processing unit 120 determines whether an edit field corresponding to the received key input is the same as an edit field corresponding to a last received key input. If the edit field corresponding to the received key input is not the same as the edit field corresponding to the last received key input, in step 515, the processing unit 120 sets the long-press delay time to be a predetermined value.

In addition, the processing unit 120 clears all the time stamps recorded in the storage unit 130. Namely, the storage unit 130 only stores the time stamps corresponding to the same edit field, and the data in the storage unit 130 is cleared once the user changes to another edit field. However, if the processing unit 120 determines that the edit field is not changed, the following steps 520-560 are the same as or similar to the steps 210-250 in FIG. 2 therefore will not be described herein.

It should be noted that in steps 415 and 515, the processing unit 120 sets the long-press delay time directly to be a predetermined value, wherein the predetermined value may be any predetermined value stored in the electronic device 100 or determined by the user. In an embodiment, the predetermined value stored in the electronic device 100 may be the same as the larger second predetermined value.

In the embodiments illustrated in FIGS. 2, 4, and 5, if the processing unit 120 failed to acquire n qualified time stamps from the time stamps recorded in the storage unit 130 (i.e., the time stamps recorded in the storage unit 130 are not enough for forming the n qualified time stamps), the processing unit 120 sets the long-press delay time of the key of the electronic device 100 to be a predetermined value. It should be noted that the predetermined value may be any predetermined value stored in the electronic device 100 or determined by the user. In an embodiment, the predetermined value stored in the electronic device 100 may be the same as the larger second predetermined value.

In another embodiment of the present application, the processing unit 120 may also compare the input time of m key inputs that can reflect the key input rate with multiple threshold time, so as to adjust the long-press delay time of the key of the electronic device 100 in multiple stages. For example, if the input time of m key inputs is less than a first threshold time (for example, 1500 ms), the processing unit 120 sets the long-press delay time to be 400 ms. If the input time of m key inputs is greater than a second threshold time (for example, 5000 ms), the processing unit 120 sets the long-press delay time to be 750 ms. If the input time of m key inputs is between the first threshold time and the second threshold time, the processing unit 120 sets the long-press delay time to be 600 ms.

In yet another embodiment of the present application, the processing unit 120 may also set different threshold time according to the type of the edit field, and the key input rate may be determined according to the threshold time corresponding to the current edit field used by the user.

The present application also provides a computer-readable medium. The computer-readable medium is composed of a plurality of program instructions (for example, settings program instructions or deployment program instructions). These program instructions can be loaded into an electronic device and executed by the same to accomplish the steps in the method of dynamically adjusting long-press delay time of the key of the electronic device in embodiments described above. The computer-readable medium may be a real only memory, a random access memory, a magnetic tape, a floppy disc, a compact disc, or a transmission medium.

As described above, the present application provides a method of dynamically adjusting a long-press delay time, an electronic device, and a computer-readable medium, wherein the long-press delay time of the key of the electronic device is adjusted according to the key input rate related to the received key inputs, so that the speed of the electronic device starting a long-press function can be adjusted according to the typing speed of a user. Thereby, the input operation of the user in the electronic device is made very smooth and convenient.

It will be apparent to those skilled in the art that various modifications and variations can be made to the structure of the present application without departing from the scope or spirit of the application. In view of the foregoing, it is intended that the present application cover modifications and variations of this application provided they fall within the scope of the following claims and their equivalents.

What is claimed is:

1. A method of dynamically adjusting long-press delay time, adaptable to an electronic device having a plurality of keys, wherein the electronic device executes a long-press function corresponding to a key of the electronic device when a pressed time corresponding to the key exceeds a long-press delay time of the key, the method comprising:
   receiving a plurality of key inputs;
   setting the long-press delay time of the key of the electronic device according to a key input rate related to the received key inputs; and
   setting the long-press delay time to be a predetermined value when a received key input is corresponding to a function key input.

2. The method according to claim 1, wherein the step of setting the long-press delay time according to the key input rate related to the received key inputs comprises:
   calculating an input time corresponding to m key inputs, wherein m is a positive integer;
   setting the long-press delay time to be a first predetermined value when the input time is less than a threshold time; and
   setting the long-press delay time to be a second predetermined value when the input time is greater than the threshold time, wherein the first predetermined value is smaller than the second predetermined value.

3. The method according to claim 2, wherein the step of calculating the input time corresponding to the in key inputs comprises:
   recording a plurality of time stamps corresponding to receiving time points of the key inputs when the key inputs are received;
   acquiring n qualified time stamps from the recorded time stamps, wherein n is an integer greater than 1; and
   calculating the input time corresponding to the in key inputs according to the n qualified time stamps.

4. The method according to claim 3, wherein each of the key inputs corresponding to the n qualified time stamps is a character key input, and the step of calculating the input time corresponding to the m key inputs according to the n qualified time stamps comprises:
   calculating (m−1) time intervals according to the n qualified time stamps, wherein each of the (m−1) time intervals is obtained from two adjacent qualified time stamps; and
   calculating a total of the (m−1) time intervals as the input time corresponding to the in key inputs.

5. The method according to claim 4, wherein the character key input comprises one of a letter key input, a number key input and a symbol key input.

6. The method according to claim 3, wherein n is 2 and the key inputs corresponding to the two qualified time stamps are respectively the $i^{th}$ key input and the $(i+m-1)^{th}$ key input, and the step of calculating the input time corresponding to the m key inputs according to the n qualified time stamps comprises:
   calculating a difference between the two qualified time stamps as the input time corresponding to the m key inputs.

7. The method according to claim 3, wherein the n qualified time stamps comprise a latest time stamp among the recorded time stamps.

8. The method according to claim 3 further comprising:
   setting the long-press delay time to be a predetermined value when the n qualified time stamps are not acquired from the recorded time stamps.

9. The method according to claim 1, wherein the function key input comprises one of a backspace key input, a direction key input, and a delete key input.

10. The method according to claim 1 further comprising:
    setting the long-press delay time to be a predetermined value when an edit field corresponding to a received key input is not the same as an edit field corresponding to a last received key input.

11. An electronic device, comprising:
    a plurality of keys; and
    a processing unit, coupled to the keys, wherein:
    when a pressed time corresponding to a key of the electronic device exceeds a long-press delay time of the key, the processing unit executes a long-press function corresponding to the key; and
    the processing unit sets the long-press delay time of the key according to a key input rate related to a plurality of received key inputs,
    wherein the processing unit sets the long-press delay time to be a predetermined value when the received key input is corresponding to a function key input.

12. The electronic device according to claim 11, wherein the processing unit calculates an input time corresponding to in key inputs, the processing unit sets the long-press delay time to be a first predetermined value when the input time is less than a threshold time, and the processing unit sets the long-press delay time to be a second predetermined value when the input time is greater than the threshold time, wherein m is a positive integer, and the first predetermined value is smaller than the second predetermined value.

13. The electronic device according to claim 12 further comprising:
    a storage unit, coupled to the processing unit, wherein:
    the processing unit records a plurality of time stamps corresponding to receiving time points of the key inputs into the storage unit when receiving the key inputs, and the processing unit acquires n qualified time stamps from the time stamps recorded in the storage unit and calculates the input time corresponding to the m key inputs according to the n qualified time stamps, wherein n is an integer greater than 1.

14. The electronic device according to claim 13, wherein each of the key inputs corresponding to the n qualified time stamps is a character key input, and the processing unit calculates (m−1) time intervals according to the n qualified time stamps and calculates a total of the (m−1) time intervals as the input time corresponding to the m key inputs, wherein each of the (m−1) time intervals is obtained from two adjacent qualified time stamps.

15. The electronic device according to claim 14, wherein the character key input comprises one of a letter key input, a number key input, and a symbol key input.

16. The electronic device according to claim 13, wherein n is 2, the key inputs corresponding to the two qualified time stamps acquired by the processing unit are respectively the $i^{th}$ key input and the $(i+m-1)^{th}$ key input, and the processing unit calculates a difference between the two qualified time stamps as the input time corresponding to the m key inputs.

17. The electronic device according to claim 13, wherein the n qualified time stamps comprise a latest time stamp among the time stamps recorded in the storage unit.

18. The electronic device according to claim 13, wherein the processing unit sets the long-press delay time to be a predetermined value when the n qualified time stamps are not acquired from the time stamps recorded in the storage unit.

19. The electronic device according to claim 11, wherein the function key input comprises one of a backspace key input, a direction key input, and a delete key input.

20. The electronic device according to claim 11, wherein the processing unit sets the long-press delay time to be a predetermined value when an edit field corresponding to a received key input is not the same as an edit field corresponding to a last received key input.

21. A computer-readable medium comprising stored thereon instructions, which, when executed by a processor in an electronic device having a plurality of keys, cause the processor to perform the operations of:
- receiving a plurality of key inputs;
- setting a long-press delay time of a key of the electronic device according to a key input rate related to the received key inputs; and
- setting the long-press delay time to be a predetermined value when a received key input is corresponding to a function key input,
- wherein when a pressed time corresponding to the key exceeds the long-press delay time of the key, the processor executes a long-press function corresponding to the key.

\* \* \* \* \*